United States Patent
Chien

(10) Patent No.: US 8,881,377 B2
(45) Date of Patent: Nov. 11, 2014

(54) METHOD FOR DETERMINING A CRITICAL DIMENSION AT A PLANE OF INTEREST FROM A MEASUREMENT TAKEN AT A TEST PLANE

(75) Inventor: Chester X. Chien, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 995 days.

(21) Appl. No.: 12/975,057

(22) Filed: Dec. 21, 2010

(65) Prior Publication Data

US 2012/0151752 A1 Jun. 21, 2012

(51) Int. Cl.
| G11B 5/187 | (2006.01) |
| G11B 5/31 | (2006.01) |
| G11B 5/127 | (2006.01) |
| H01L 23/31 | (2006.01) |
| H01L 21/30 | (2006.01) |
| H01L 21/302 | (2006.01) |

(52) U.S. Cl.
CPC .......... G11B 5/3116 (2013.01); *H01L 23/3178* (2013.01); *H01L 21/30* (2013.01); *H01L 21/302* (2013.01); G11B 5/1871 (2013.01); G11B 5/1278 (2013.01); G11B 5/315 (2013.01); G11B 5/3166 (2013.01); G11B 5/3196 (2013.01)
USPC .................... 29/603.1; 29/603.09; 29/603.13; 29/603.15; 29/603.16; 29/417; 29/852; 438/113; 438/667; 205/119

(58) Field of Classification Search
CPC .. G11B 5/1278; G11B 5/1871; G11B 5/3116; G11B 5/3196; G11B 5/3166; G11B 5/315; H01L 21/30; H01L 21/302; H01L 22/30; H01L 22/34; H01L 23/3178
USPC ............................. 29/603.07, 603.09, 603.1, 29/603.12–603.16, 412, 417, 852; 438/14, 438/33, 113, 667, 675; 205/119, 125
See application file for complete search history.

(56) References Cited

U.S. PATENT DOCUMENTS

| 6,964,874 B2 * | 11/2005 | Werner et al. .................... 438/14 |
| 7,064,046 B2 * | 6/2006 | Wakui et al. .............. 438/113 X |
| 7,433,151 B2 * | 10/2008 | Sasaki et al. .......... 29/603.14 X |
| 7,867,825 B2 * | 1/2011 | Kim et al. ..................... 438/113 |

FOREIGN PATENT DOCUMENTS

JP 2009015966 A * 1/2009

* cited by examiner

*Primary Examiner* — A. Dexter Tugbang
(74) *Attorney, Agent, or Firm* — Zilka-Kotab, PC

(57) ABSTRACT

A method for determining a critical dimension of a structure along a plane of interest from a measurement along a test plane that is not necessarily located at the plane of interest. The method involves slicing a structure along a test plane and measuring a marker feature in this test plane. A determination of a critical dimension of a feature at the plane of interest is then determined based on the measurement of the marker feature measurement at the test plane. This testing methodology can be useful, for example in the measurement of a critical dimension of a write pole at an air bearing surface plane form a measurement of a test feature at a plane that is not necessarily located at the air bearing surface plane.

21 Claims, 21 Drawing Sheets

METHOD FOR DETERMINING A CRITICAL DIMENSION AT A PLANE OF INTEREST FROM A MEASUREMENT TAKEN AT A TEST PLANE

FIELD OF THE INVENTION

The present invention relates to perpendicular magnetic write heads and more particularly to a method for defining a narrow track width magnetic write pole of a magnetic write head.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head can include a magnetic write pole and a magnetic return pole, the write pole having a much smaller cross section at the ABS than the return pole. The magnetic write pole and return pole are magnetically connected with one another at a region removed from the ABS. An electrically conductive write coil induces a magnetic flux through the write coil. This results in a magnetic write field being emitted toward the adjacent magnetic medium, the write field being substantially perpendicular to the surface of the medium (although it can be canted somewhat, such as by a trailing shield located near the write pole). The magnetic write field locally magnetizes the medium and then travels through the medium and returns to the write head at the location of the return pole where it is sufficiently spread out and weak that it does not erase previously recorded bits of data.

The profile of the write pole at the air bearing surface greatly affects the performance of the write head. Such critical dimensions of the write pole at the air bearing surface include track width, taper angle of the write pole sides and the straightness or curvature of the write pole sides as wells as the trailing edge. It is desirable to test the write head during manufacture to ensure that the write pole has the proper configuration at the air bearing surface. However, precisely locating the air bearing surface plane for testing during manufacture is impractical due to the limitations of current measurement techniques.

SUMMARY OF THE INVENTION

The present invention provides a method for determining a critical dimension of a structure along a plane of interest from a measurement taken along a test plane that is not necessarily located at the plane of interest. The method involves slicing a structure along a test plane and measuring a marker feature in this test plane. A determination of a critical dimension of a feature at the plane of interest is then determined based on the measurement of the marker feature measurement at the test plane.

This testing methodology can be useful, for example in the measurement of a critical dimension of a write pole at an air bearing surface plane form a measurement of a test feature at a plane that is not necessarily located at the air bearing surface plane. This can be especially useful when the air bearing surface plane of the write head is located at a flare point of the write pole, where the critical features of the write pole vary greatly with test plane location.

This process can also be especially advantageous for testing a critical dimension of a write pole that has been constructed by a damascene process wherein an outer trench is first formed, which is defined by an accurate photolithographic process, and an inner trench is formed within the outer trench by depositing a material into the outer trench. A magnetic metal is then electroplated into the inner trench to form a magnetic write pole, the dimensions of which are defined by the inner trench. A slice is made along a test plane (which need not be located exactly at the air bearing surface) and a measurement is made of the dimension of the outer trench. From this measurement one can determine a critical dimension of interest of the write pole at the actual plane of interest (e.g. the ABS) based on a known relationship between plane location and outer trench marker dimension.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
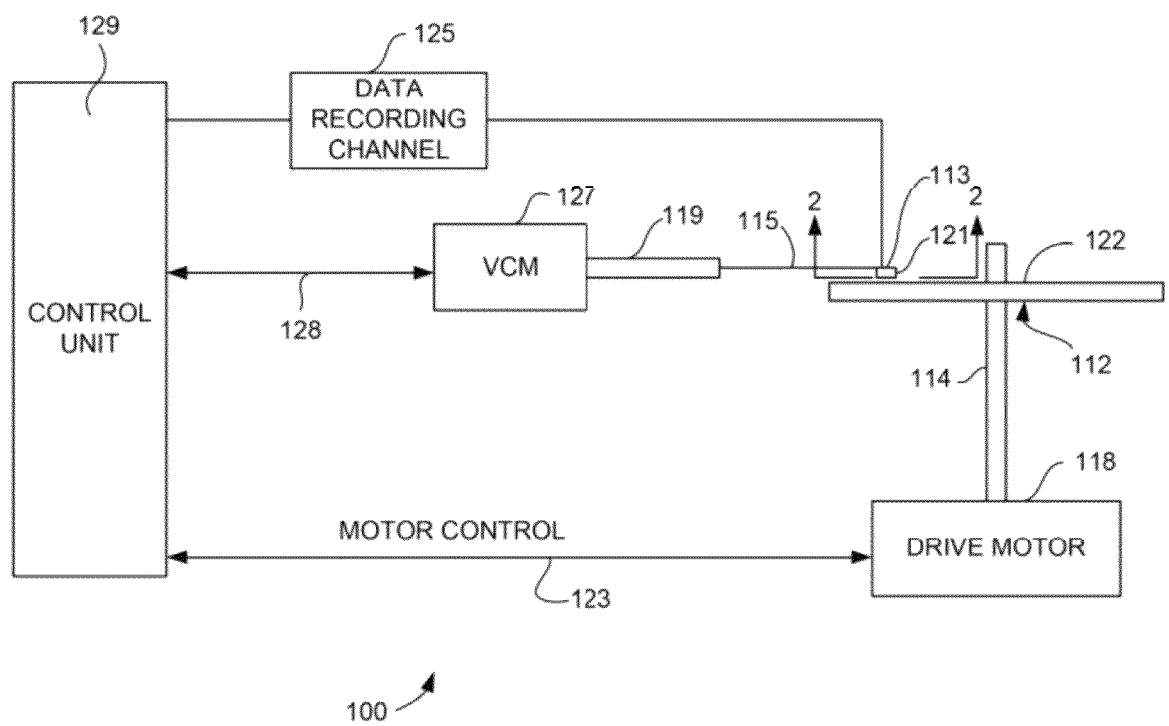
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
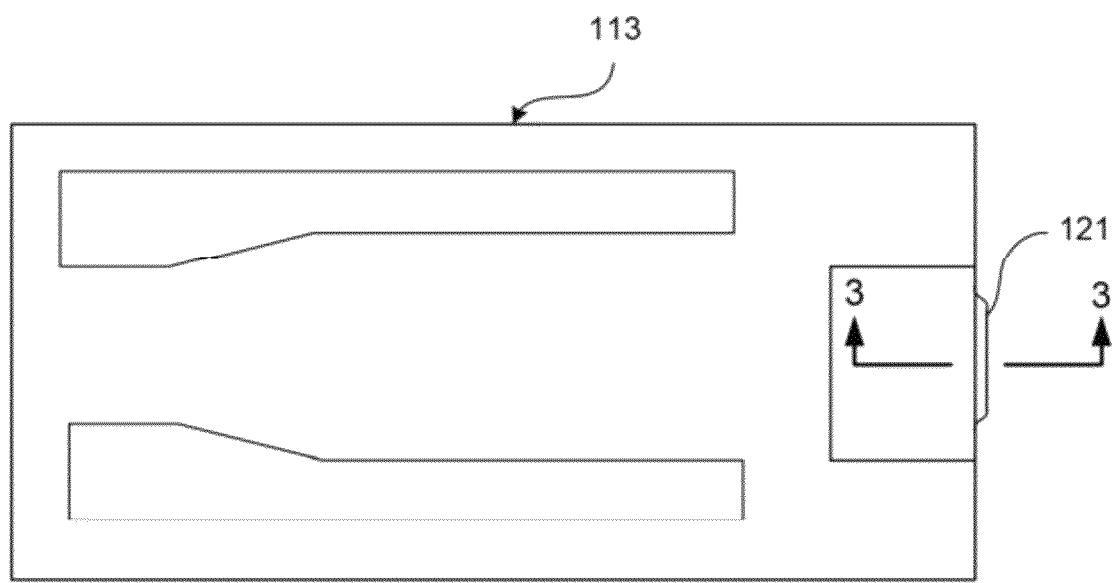
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
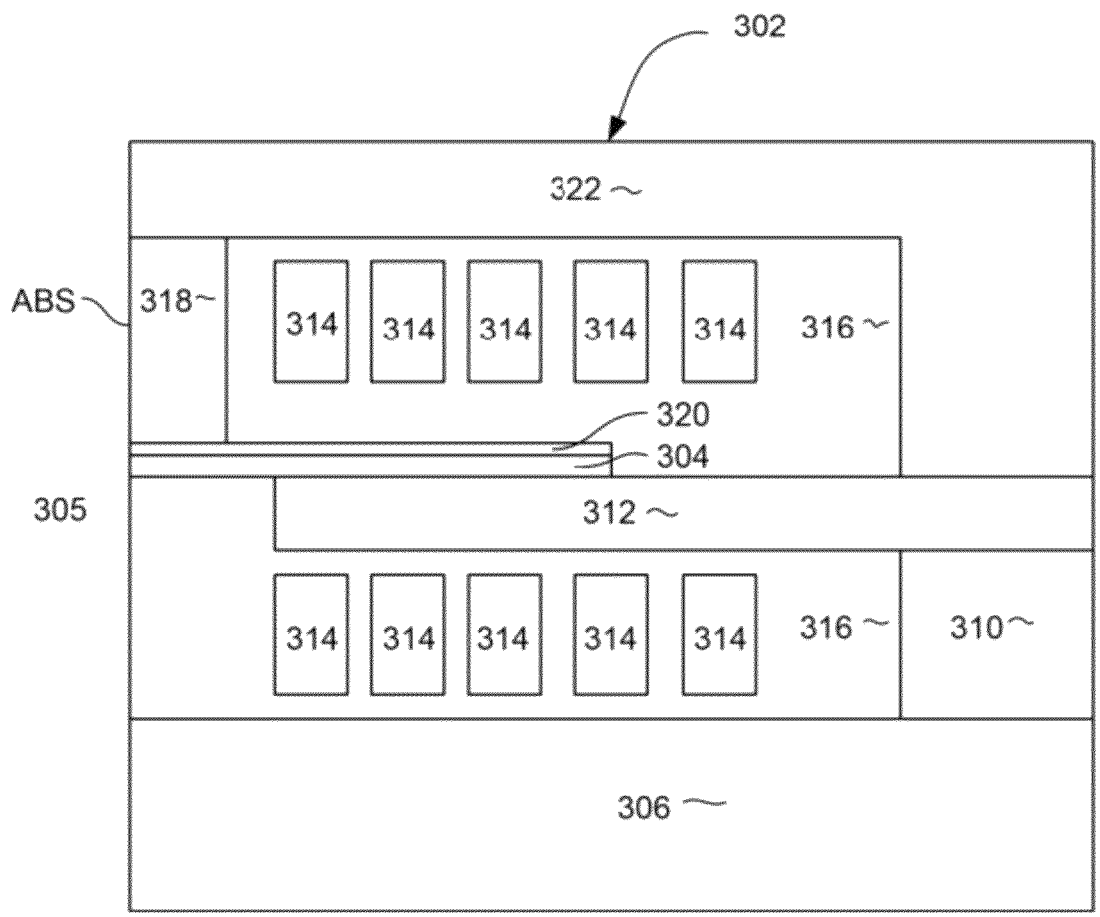
FIG. 3 is a cross sectional view of a magnetic head, taken from line 3-3 of FIG. 2 and rotated 90 degrees counterclockwise, of a magnetic head according to an embodiment of the present invention.

With reference now to FIG. 3, the invention can be embodied in a magnetic head 302, which is formed upon the trailing edge of the slider 113 (FIG. 2). The write head 302 includes a magnetic write pole 304 and a magnetic return pole 306. The return pole 306 has a cross section at the air bearing surface (ABS) that is much greater than the cross section of the write pole 304 at the ABS. The write pole 304 and return pole 306 are connected with one another in a region removed from the ABS by a magnetic back gap layer 310, and by a magnetic shaping layer 312 that connects the back gap 310 with the write pole 304 and channels magnetic flux to the smaller write pole 304. The return pole 306, back gap 310 and shaping layer 312 can each be constructed of a magnetic material such as CoFe. The write pole 304 can be a lamination of magnetic layers such as CoFe separated by thin layers of non-magnetic material. This laminated write pole structure is formed by a process described below, and is helpful in reducing eddy currents in the write pole and increasing magnetic switching within the write pole 304.

A non-magnetic, electrically conductive write coil 314, shown in cross section in FIG. 3, passes between the write pole 304 and the return pole 306, and preferably also passes above the write pole 304. The write coil can be embedded in a non-magnetic, electrically insulating layer 316 such as one or more layers of alumina and or hard baked photoresist.

When a current flows through the write coil 314, the resulting magnetic field causes a magnetic flux to flow through the return pole 306, back gap layer 310 shaping layer 312 and write pole 304. That results in a magnetic write field being emitted from the tip of the write pole 304 at the ABS. Because the write pole 304 has a small cross section at the ABS, the write field is dense and strong and can write a magnetic bit to a magnetic medium passing by the ABS of the write head 302. This magnetic write field passes through the magnetic medium before returning to the return pole 306. Because the return pole 306 has a much larger cross section at the ABS, the magnetic field returning to the return pole 306 is sufficiently spread out and weak that it does not erase the previously recorded bit.

In order to increase the field gradient of the magnetic field emitted from the write pole, and thereby increase the write speed, a magnetic trailing shield 318 can be formed adjacent to the trailing edge of the write pole 304. The trailing magnetic shield 318 can be magnetically connected with the rest of the magnetic structure at the back of the write head 302 by a trailing return pole structure 322. The trailing magnetic shield 318 is separated from the write pole 304 by a non-magnetic trailing gap layer 320.

Figure 4:
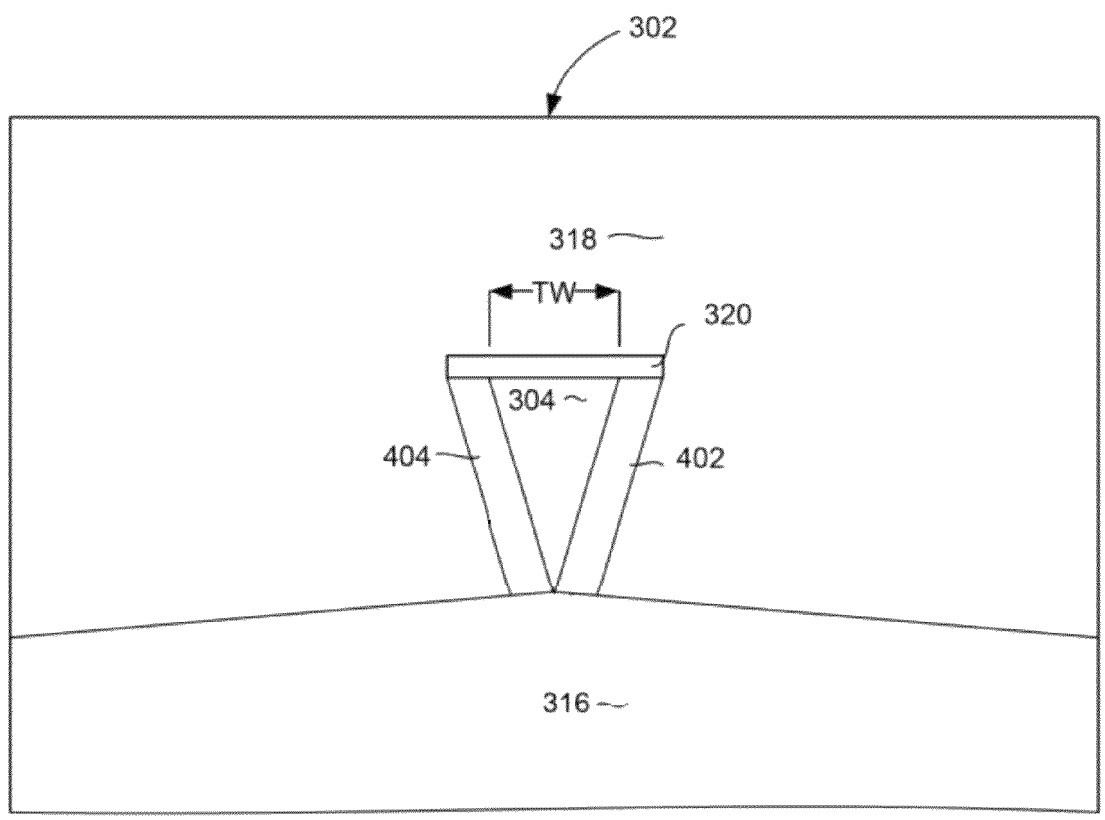
FIG. 4, is an ABS view of a portion of the write head of FIG. 3, shown enlarged as seen from line 4-4 of FIG. 3.
Figure 5:
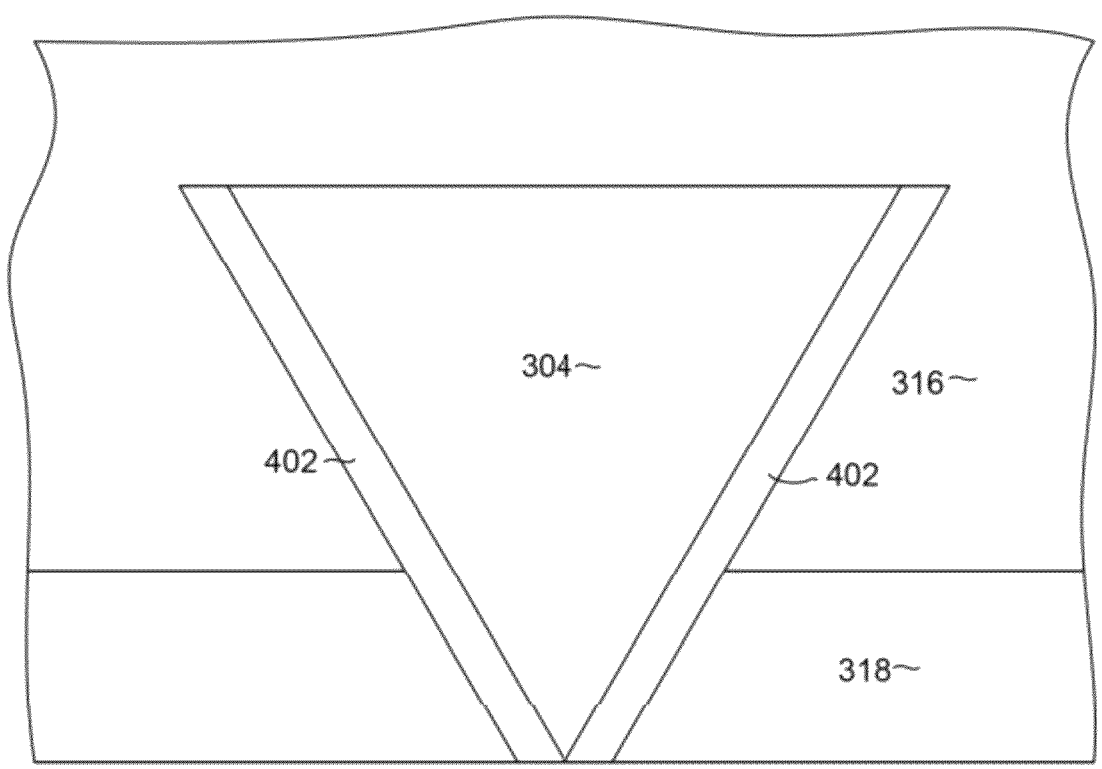
FIG. 5 is a top down view of a write pole of the write head of FIGS. 3 and 4.

With reference now to FIG. 4, the write pole 304 can be seen as viewed from the air bearing surface (ABS), as viewed from line 4-4 of FIG. 3. And FIG. 5 shows a top down view of the write pole 304. As can be seen, the write pole has a triangular shape. This is the result of a manufacturing process that will be described below and helps to avoid skew related adjacent track interference. Also, as can be seen in FIG. 4, the trailing shield 318 can wrap around the sides of the write pole 304 to provide side shielding. The side portions of the shield 318 are separated from the write pole 304 by first and second non-magnetic side gap layers. As shown in FIG. 4, the width of the write pole 304 defines a track width (TW) of the write head 302. This profile of the write pole 404 at the air bearing surface (ABS) is of critical importance in the performance of the write head 302. Critical parameters include the width of the trailing edge TW, as well as the angle of taper of the sides 406 and shape of the sides 404 (e.g. straight, as shown, or curved). Proper evaluation of this write pole profile at the ABS during manufacture of the write head has been hampered by the inability to very accurately locate the ABS plane during manufacture of the write pole 304 on a wafer for testing. The present invention provides an efficient means to accurately inspect this write pole configuration during manufacture. This will be better understood after reading the following example of a method for manufacturing a write pole as described below with reference to FIGS. 6-16.

Figure 6:
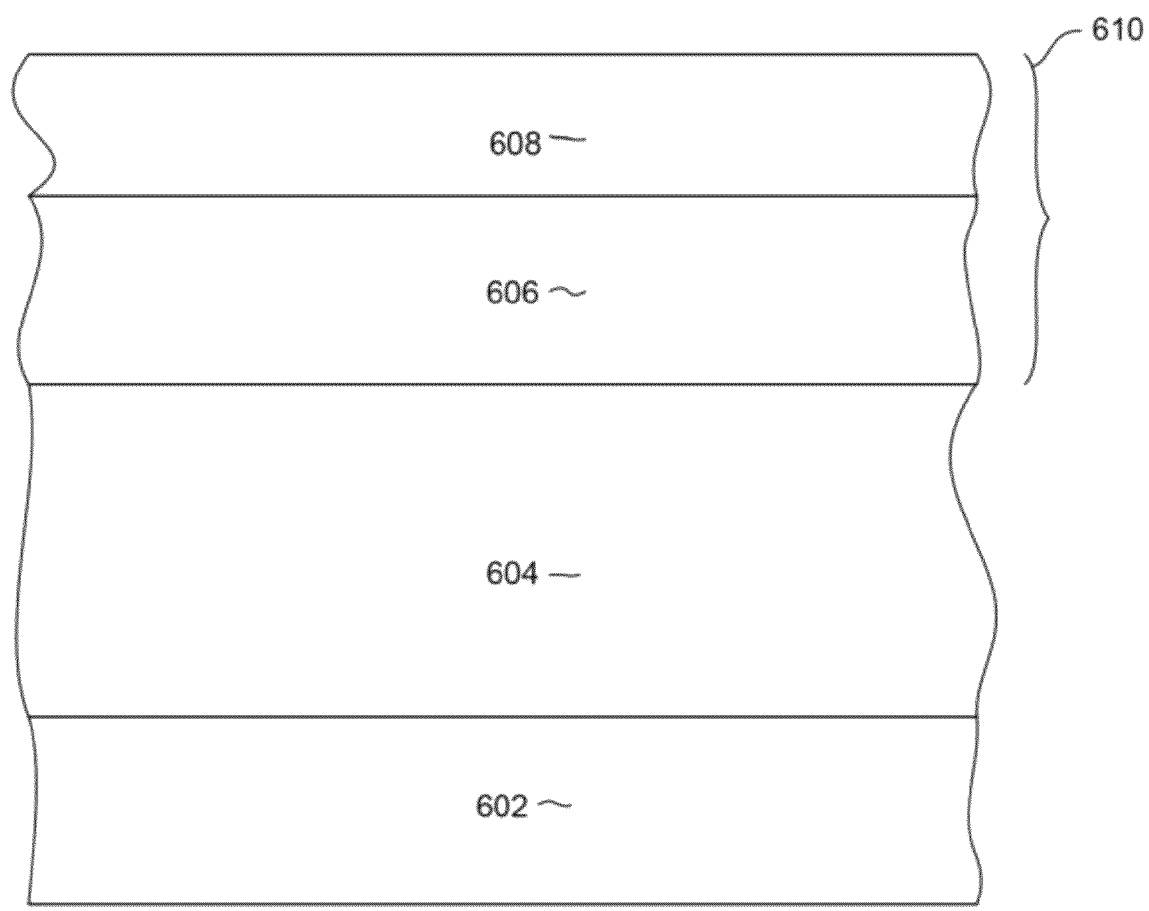
FIGS. 6-16 are views of a write pole in various intermediate stages of manufacture, illustrating a method for manufacturing a write head according to an embodiment of the invention.

FIGS. 6-16 illustrate a method for manufacturing a magnetic write pole according to an embodiment of the invention. With particular reference to FIG. 6, a substrate 602 is provided and layer of RIAble material 604 is deposited sufficiently thick to provide a trench for forming a write pole, as will be understood below. The RIEable material 604 is preferably alumina ($Al_2O_3$). A series of mask layers 610 is deposited over the RIEable layer 604. This mask structure can include an image transfer layer 606 and a photoresist layer 608. The image transfer layer 606 can be a soluble polyimide material such as DURIMIDE, and in addition to functioning as an image transfer layer can also function as a Bottom Anti-Reflective Coating (BARC).

Figure 7:
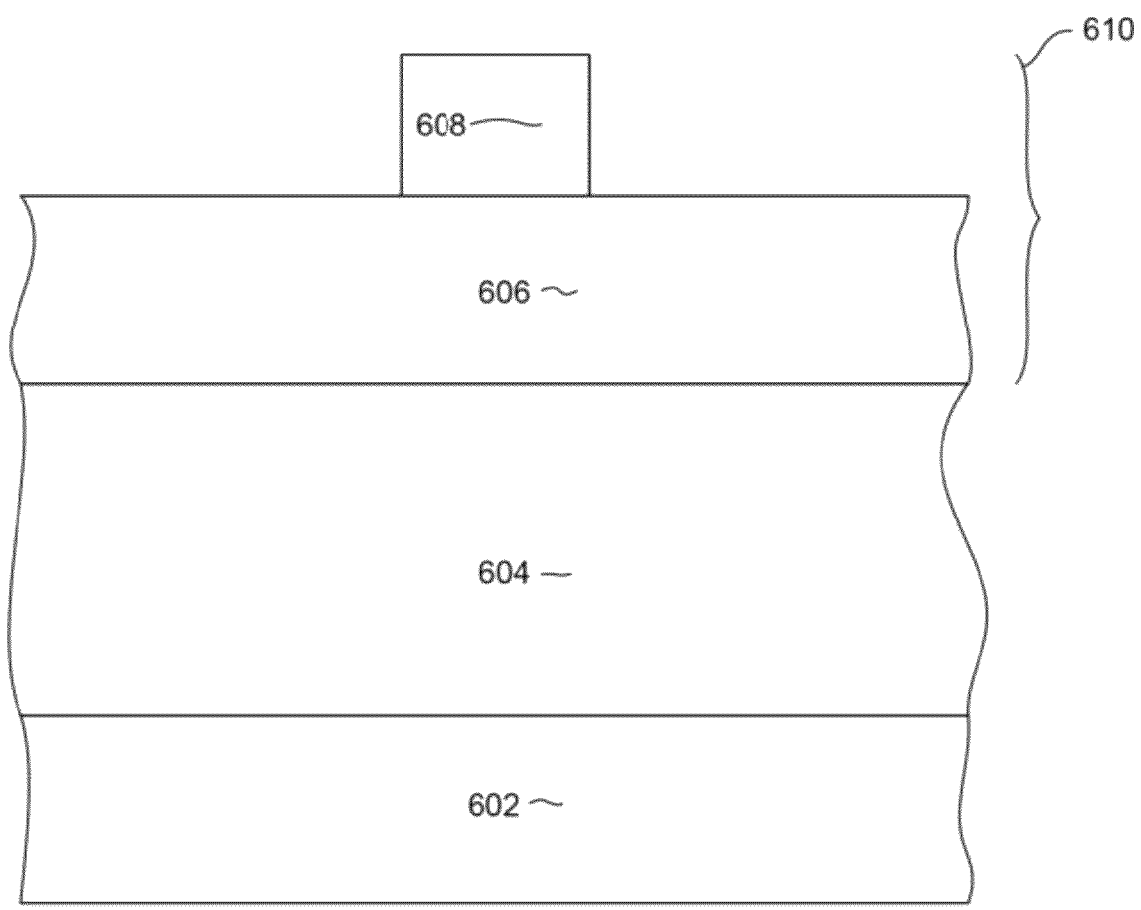
Figure 8A:
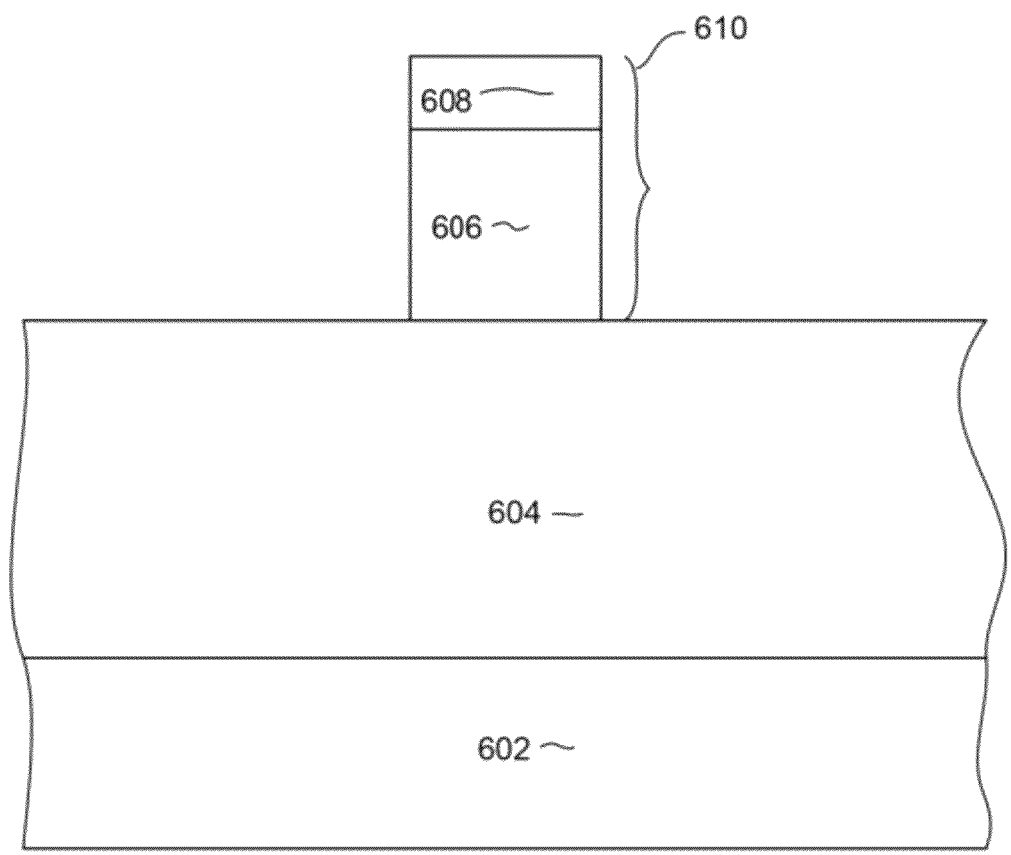
Figure 8B:
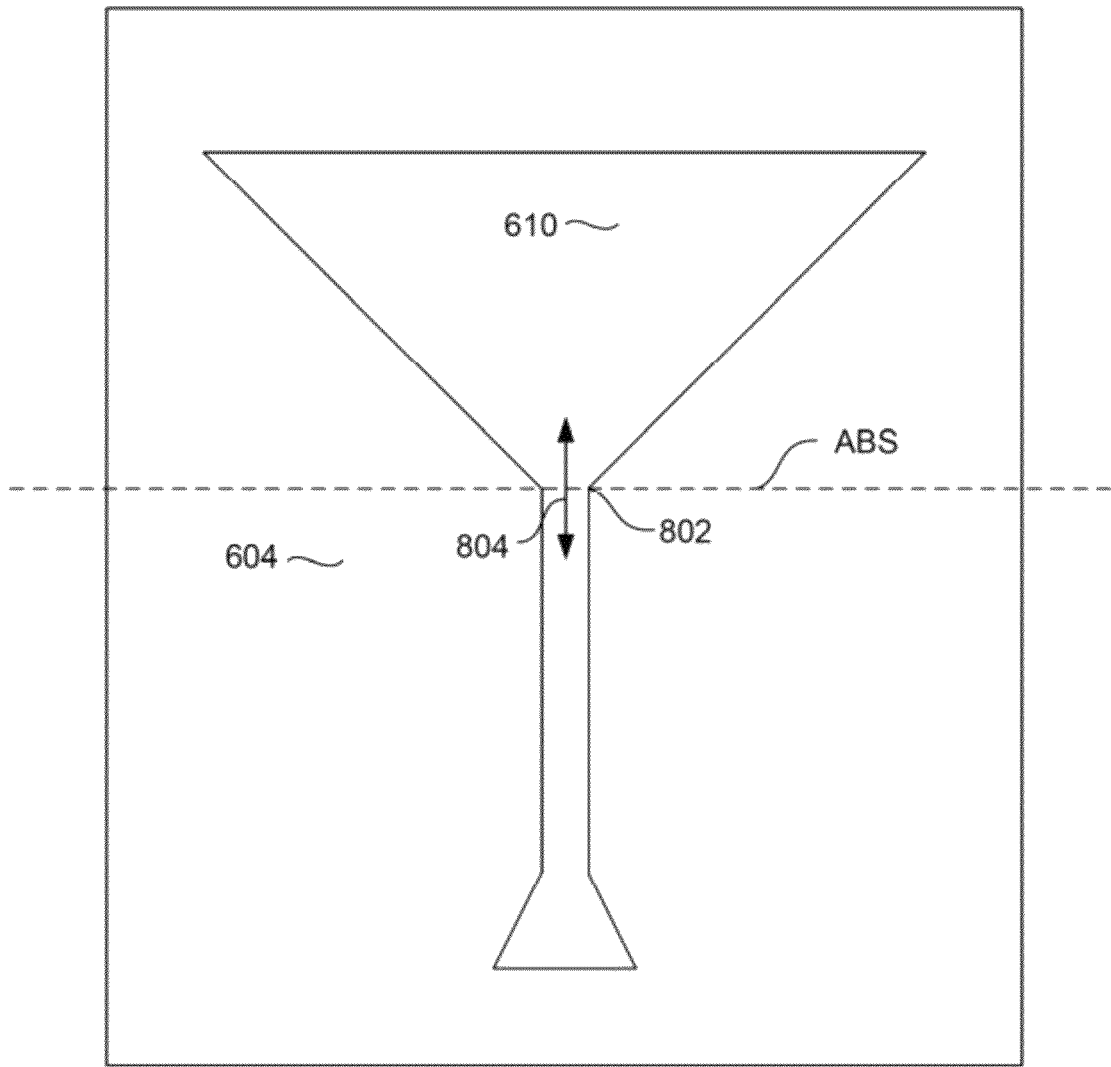

Then, the photoresist layer 608 is photolithographically patterned and developed to form a mask 608 as shown in FIG. 7. A reactive ion etching can then be performed to transfer the image of the photoresist mask onto the underlying image transfer layer 606 leaving a structure as shown in FIG. 8A. FIG. 8B shows a top down view of the mask structure 610. The location of an intended air bearing surface plane is indicated by the dashed line denoted (ABS). As will be appreciated by those skilled in the art, the air bearing surface of the write head will be formed by a slicing and lapping operation after the write head is formed on a wafer (along with thousands of other write heads). As can be seen, the air bearing surface plane is located at the flare point 802 of the mask (which will also define the write pole). Because the ABS is located at the flare point 802, the track width in this region varies greatly with location along a longitudinal axis 804 measured along a direction perpendicular to the ABS plane.

Figure 9:
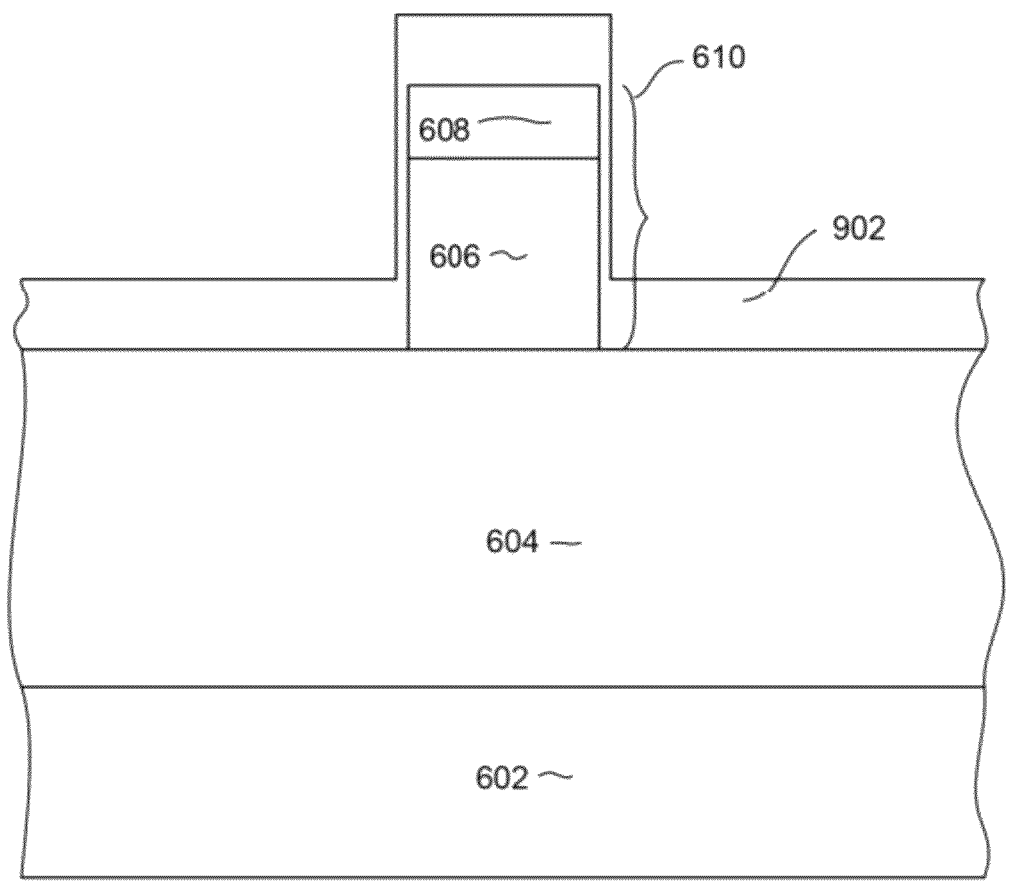
Figure 10:
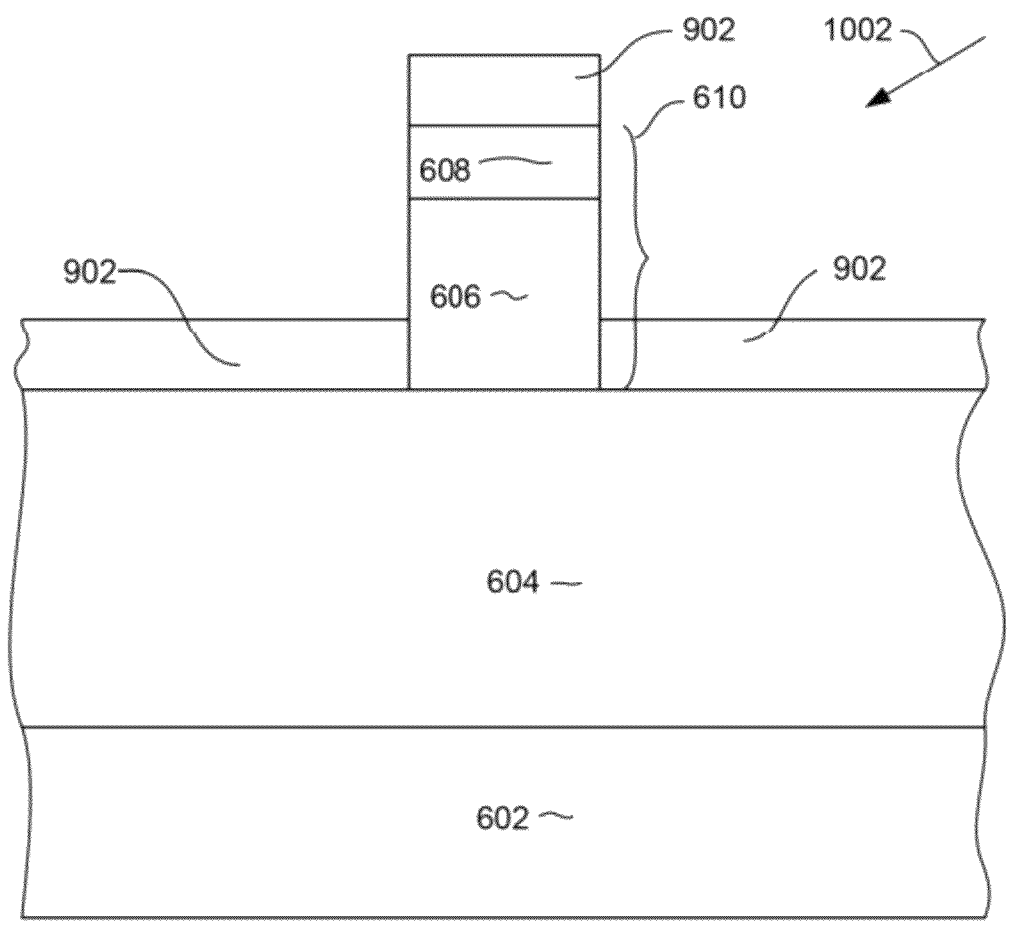
Figure 11:
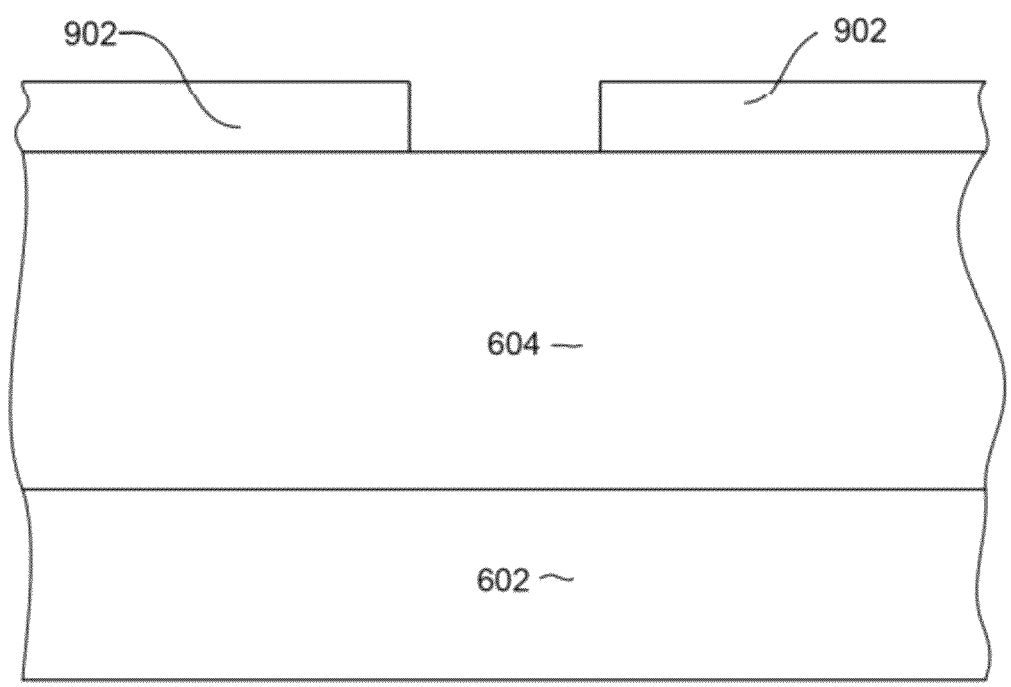

With reference now to FIG. 9, a layer of hard mask material 902 is deposited full film. This material 902 is preferably a metal such as Ta or NiCr and can be a combination of layers of such materials. The layer 902 is chosen to be resistant to an ion milling process that will be performed to form a trench in the RIEable layer 604, as will be described below. Then, with reference to FIG. 10, an ion milling is performed at an angle as indicated by arrow 1002. This ion milling is performed at such an angle so that directionality of the ion milling will remove the vertically disposed hard mask material 902 from the sides of the mask 610, exposing the sides of the mask 610 and leaving a structure as shown in FIG. 10. Then, a liftoff process such as a chemical liftoff process can be used to remove the mask 610, leaving a structure as shown in FIG. 11.

Figure 12:
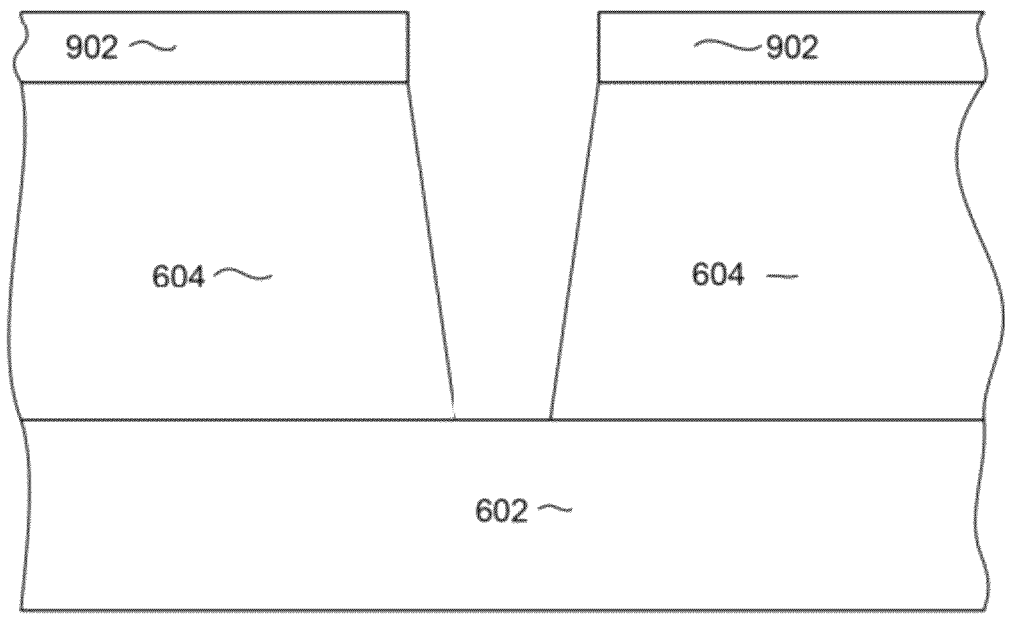

With reference now to FIG. 12, a reactive ion etching is performed to remove portions of the RIEable layer 604 that are not protected by the remaining hard mask 902. If the RIEable layer 604 is alumina, the reactive ion etching is preferably performed using a $CHF_3$ chemistry. The reactive ion etching is also preferably performed in such a manner as to form a trench having straight, angled sides walls as shown. The sides preferably have an angle of 10-20 degrees relative to normal. Process conditions that can be controlled to affect this side wall profile include etch rate and process time.

Figure 13:
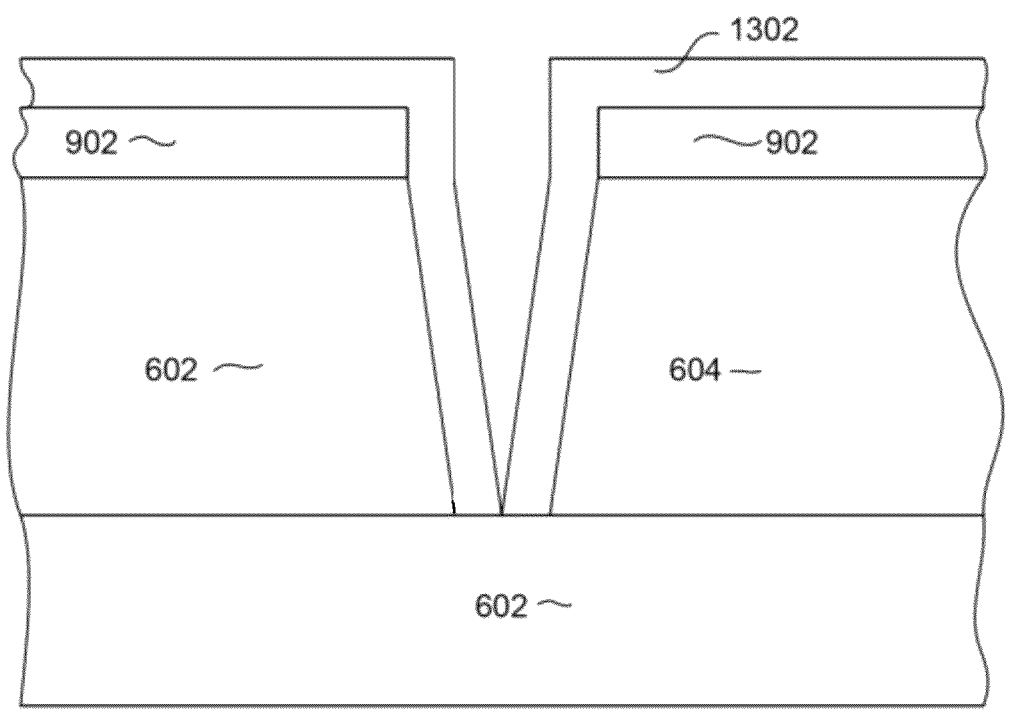
Figure 14:
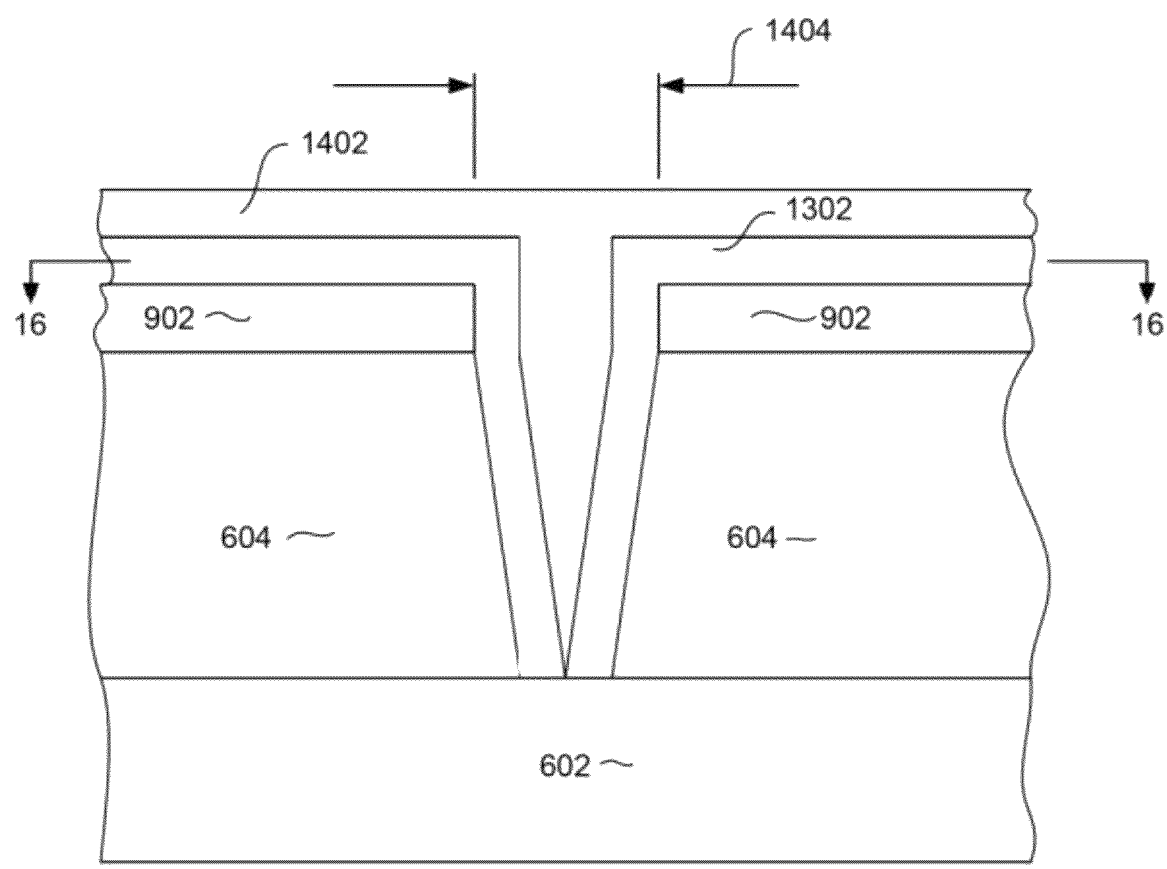

With reference now to FIG. 13, a layer of non-magnetic metal such as Ru 1302 is deposited full film. This layer 1302 is deposited by a conformal deposition process such as atomic layer deposition so that it evenly coats the insides of the trench. This non-magnetic layer 1302 effectively reduces the width of the trench. The material 1302 is also preferably an electrically conductive metal so that it can also act as an electroplating seed layer. With reference now to FIG. 14, a layer of high Bsat magnetic material such as CoFe 1402 is then deposited by electroplating so that it completely fills the trench.

It will be appreciated by those skilled in the art that, while a single write head is shown, many thousands of such write heads are formed simultaneously on a single wafer. Several of these write poles are used for testing to determine whether the proper write pole profile is being formed. In order to perform such testing a sacrificial test head sliced from the wafer at a location that is as close to the air bearing surface (ABS) as possible.

Prior art measurement techniques have required that the wafer be sliced exactly at the air bearing surface location where the write pole profile is inspected to determine whether it has an acceptable cross section profile (e.g. track width, taper angle, straightness of side walls). This testing is generally performed after the write pole has been completely formed and planarized such as by on milling and chemical mechanical polishing processes that will be described herein below. One way to locate the ABS for such testing has been to construct a feature on a portion of the write pole that will be later removed and measuring from this feature to where the ABS should be. However, the feature itself can be affected by various manufacturing processes and, therefore, has its own variation. In addition, the measurement techniques themselves have limited accuracy and, therefore, introduce their own variation. Another way to determine the location of the ABS is to determine the extrapolated intersection of the flared sides of the write pole and measure from this intersection. Again however, the measurement techniques used to determine the location of the ABS plane have limited accuracy and present variation in the location of the ABS. The present invention overcomes this problem by eliminating the need to precisely locate the ABS, as discussed below.

In the present invention, a measurement is then taken, such as by a scanning electron microscope (SEM) or 3-dimensional atomic force microscopy (AFM) to determine the width 1402 of the trench formed in the RIEable layer 604. This is the width of the portion of the trench formed in the RIEable material 604 and is not the smaller trench defined by the layer 1302.

This width 1404 measured at the top surface of RIEable material 604 provides an accurate marker for determining the pole profile at the ABS, and additionally does not have to be measured precisely at the ABS. Since the opening in the RIEAble layer 604 was formed by a very accurate photolithographic process, its width is very accurate. The inner profile defined by the layer 1302, however, is affected by other factors such as deposition thickness of the layer 1302 and is, therefore, not as accurate. By measuring the width 1404 of the RIEAble layer 604, one can determine how far the surface is from the actual air bearing surface (i.e. along axis 804 of FIG. 8B). This determines the deviation from the ABS, and from this one can extrapolate to determine what the write pole profile is at the ABS.

Figure 15:
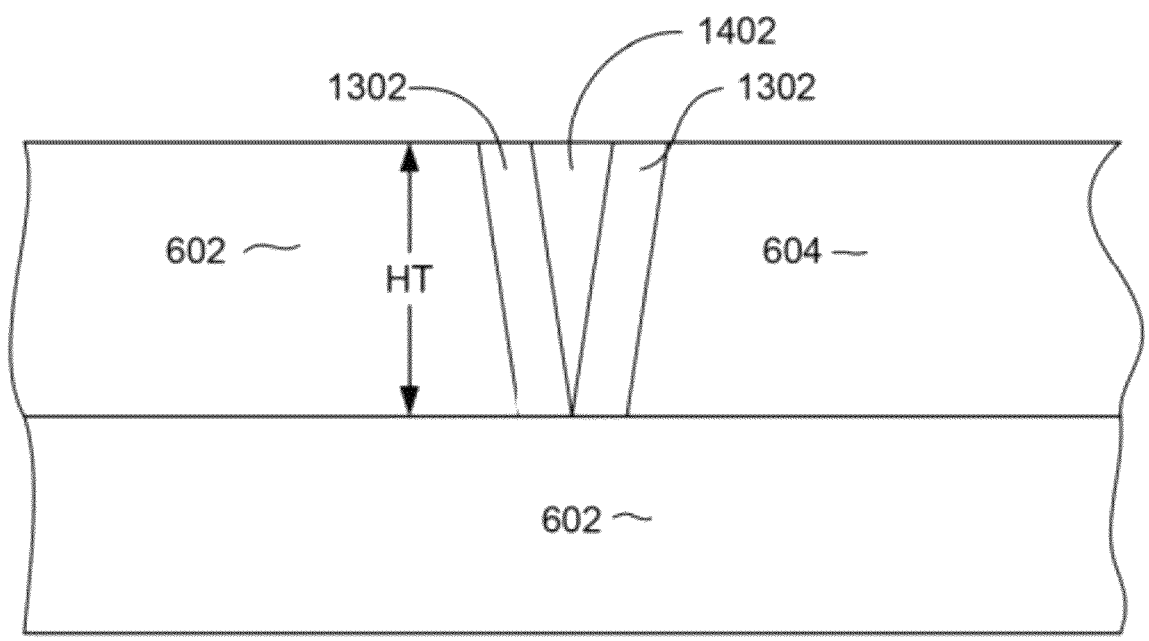

After the marker width 1404 (FIG. 14) has been measured on the test head, and if testing has shown the head to have an acceptable write pole profile, a combination of ion milling and chemical mechanical polishing is performed to remove portions of the layers 1402, 1302 that extend out of the trench and also to remove layer 902 and an upper portion of the RIEable layer 604, leaving a structure as shown in FIG. 15. This combination of ion milling and chemical mechanical polishing planarizes the surface 15, and also reduces the height HT of the write pole to a desired height. It can be seen that the previously performed measurement of the critical dimension marker width 1404 (FIG. 14) should be performed prior to this ion milling and chemical mechanical polishing process, because the dimension to be measured is actually removed, by the ion milling and chemical mechanical polishing processes.

Figure 16:
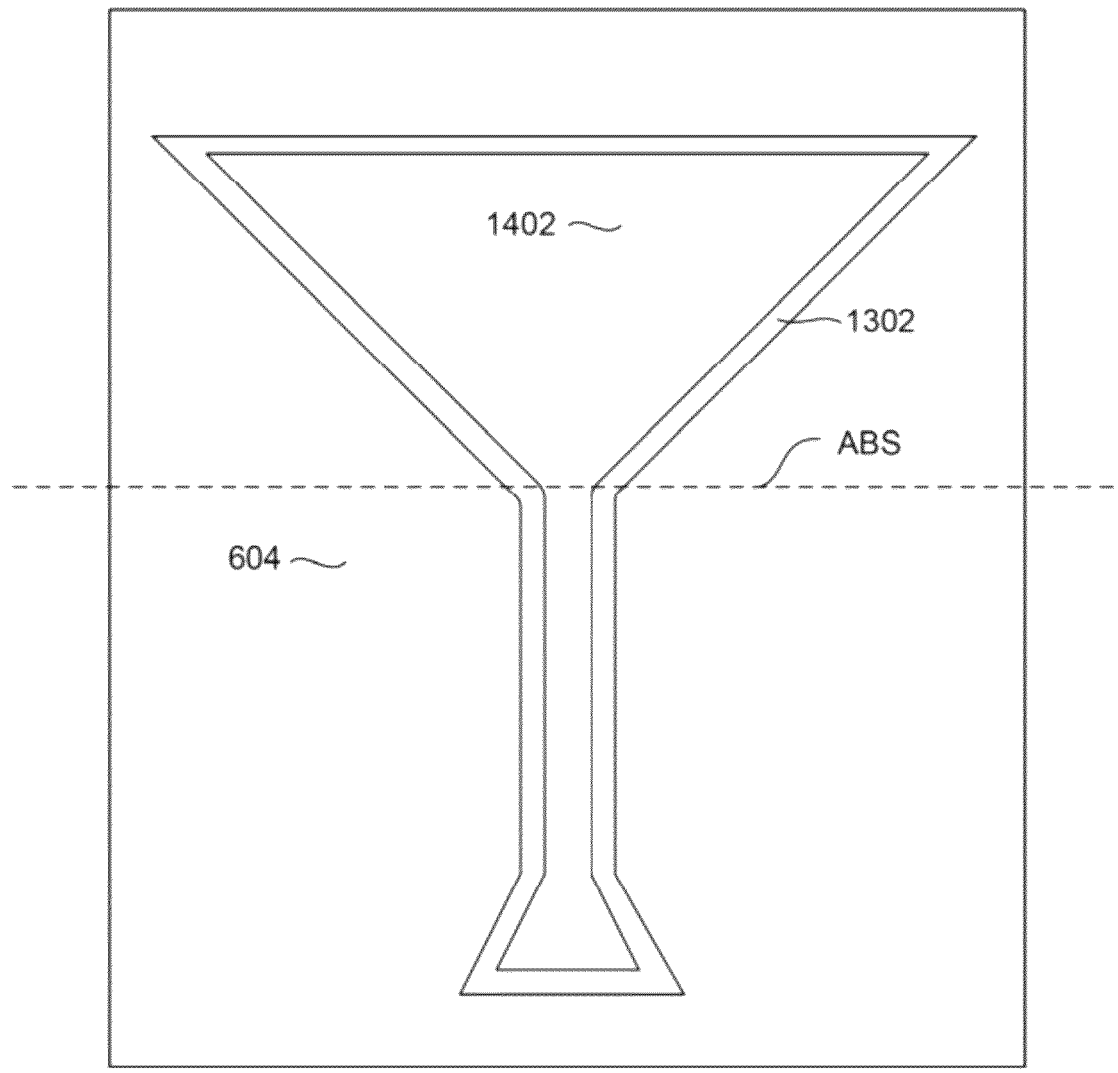
Figure 17:
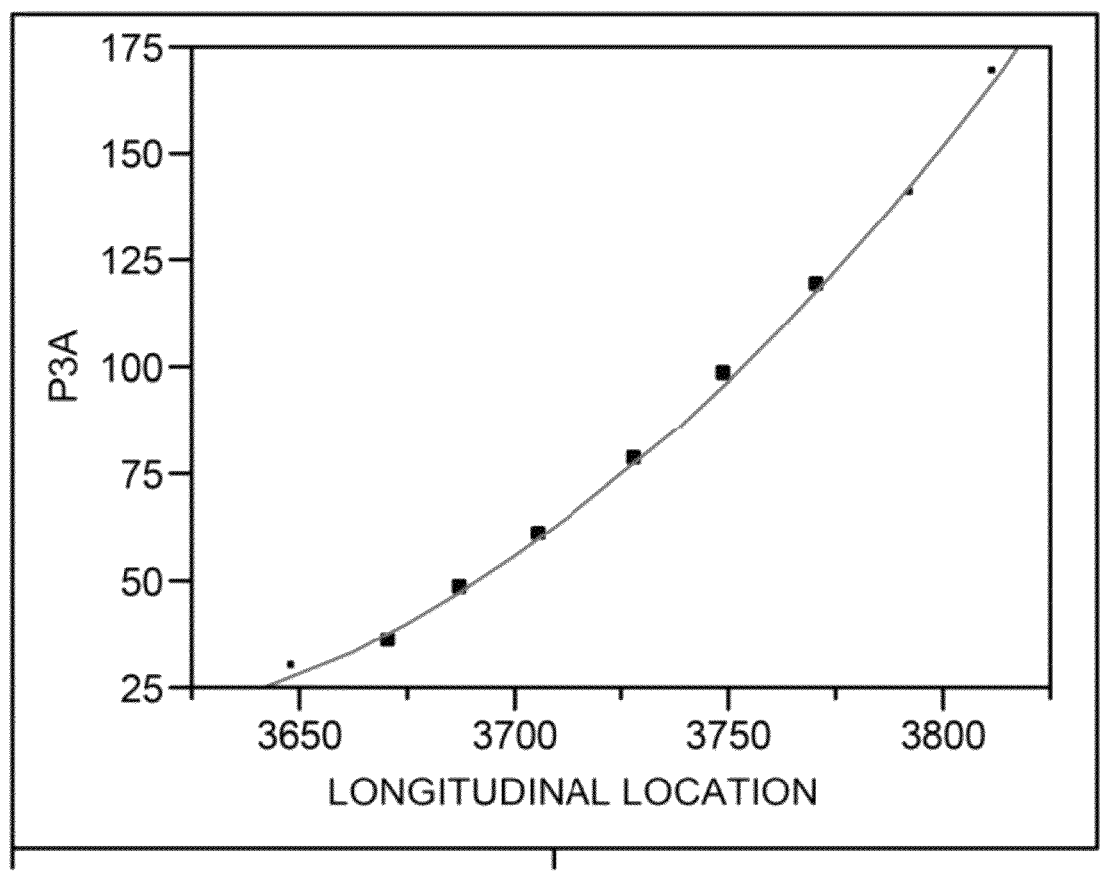
FIG. 17 is a graph illustrating how write pole width varies with longitudinal location as measured along an axis that is perpendicular to an air bearing surface plane.

FIG. 16 shows a top down view of the structure of FIG. 15. The air bearing surface plane is shown by the dashed line designated ABS. AS can be seen, the ABS plane is located at the flare point of the write pole 1402. Because the ABS is located flare point of the write head, the track width varies greatly with deviation from this intended point. FIG. 17 shows a graph of the change in write pole track with (P3A) with distance along the longitudinal axis (804 in FIG. 8B). As can be seen, the track width varies greatly with longitudinal location, but does so in a predictable manner. This predictable variation of track width makes it possible to use the previously described testing of the outer marker width 1404 (FIG. 14) to determine the profile of the write pole at the actual ABS.

The above described testing method provides several advantages over previous testing methods in that this method does not require that the measured cross section be located exactly at the ABS. As discussed above, at very small dimensions it is very difficult to locate the ABS location with extreme accuracy. In addition, this use of an internal ABS marker can be used for the same device at different process steps, and enables the consistent measurement throughout different processes.

Figure 18:
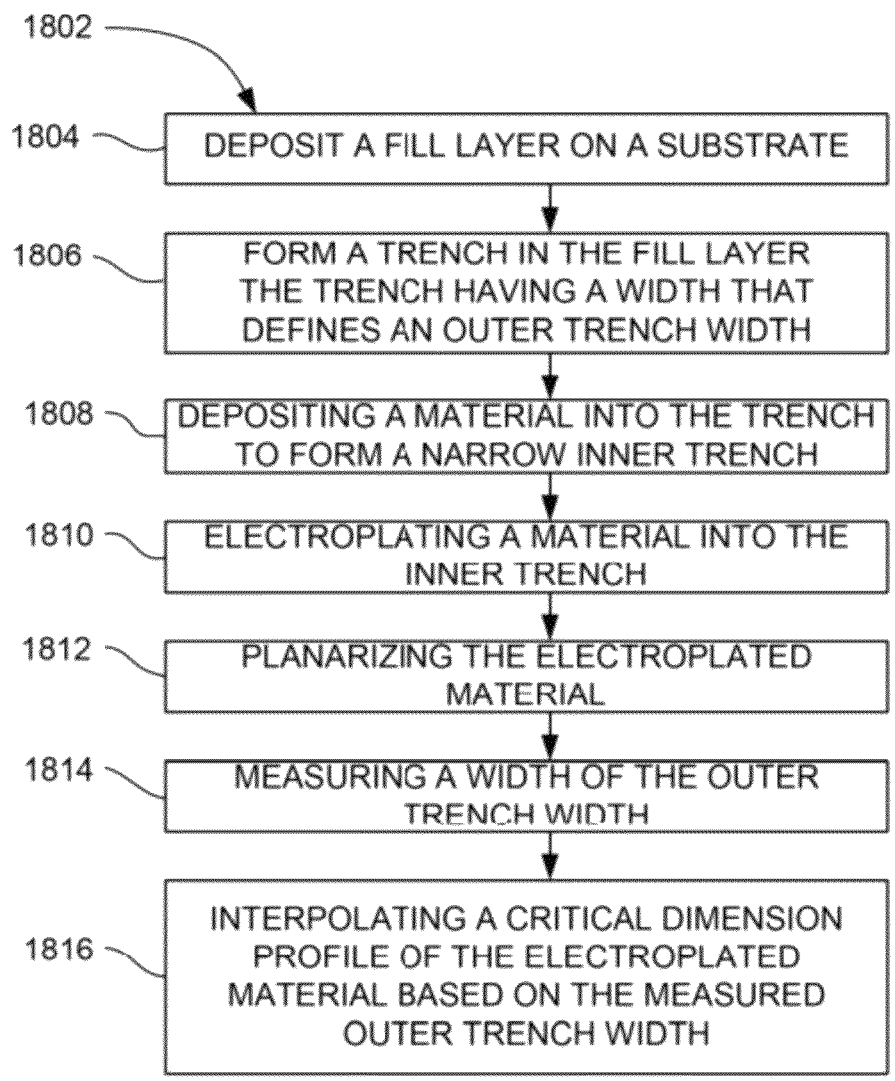
FIG. 18 is a flow chart illustrating a method for determining a critical dimension of a structure at a plane of interest based on a measurement at a test plane.

While the above method has been described in terms of measuring a critical dimension in a damascene process used to produce a magnetic write head, this is by way of example. This process can be applied to many other manufacturing situations where a damascene process is used to produce small parts, such as in semi-conductor or microcircuit fabrication. Therefore, the process described in detail above can be described more generally with regard to FIG. 18. FIG. 18 summarizes a process 1802 for using a trench marker measurement for determining a critical dimension of an electroplated structure. In a step 1804 a fill material layer is deposited over a substrate such as on a wafer. Then, in a step 1806, a trench is formed in the fill layer. This trench can be formed with a desired configuration to define a structure of interest. The trench can be formed as described above by constructing a RIE mask, and then performing a reactive ion etching to form the trench with the desired profile (i.e. side wall straightness and taper if applicable). This first trench formed in the fill material defines first or outer trench with a first or outer trench width. Then, in a step 1808, a trench width reducing material is deposited into the trench to narrow the width of the trench, thereby forming a second or inner trench having a second or inner trench width. This material is preferably deposited by a conformal deposition process such as atomic layer deposition (ALD) or Chemical Vapor Deposition (CVD). This deposition can correspond to the deposition of layer 1302 in FIG. 13 above.

Then, in a step 1810 a metallic material is electroplated into the second or inner trench defined by the material deposited above in step 1808. As can be understood, the profile of this electroplated material is defined by the profile of the inner trench. Then, in a step 1812 a planarization is performed to remove portions of the electroplated material that extend outside of the trench. This planarization can include one or more of chemical mechanical polishing and/or ion milling.

Then, in a step 1814, a measurement is made of the outer trench width. This measurement can be made by slicing the structure in a plane and inspecting that plane. Then, a step 1816, a critical dimension of the electroplated material at a desired plane of interest is determined by the measurement of the outer trench width at the plane along which the measurement has been made. While the exact location of the plane along which the slice has been made and the outer trench width has been made may not be known, the location of this plane relative to the plane of interest (of the critical dimension) can be interpolated the measured width of the outer trench.

As discussed above, the width of the outer trench at the top surface of RIEable material can be accurately defined by the photolithographic process used to define it. Therefore, the location of the test/measurement plane can be determined by the width of the outer trench at any given location (such as by a table such as that of FIG. 19). The inner trench profile, however, is not so accurately known, because of variables, such as deposition thickness of the material deposited into the trench. Therefore, as described above, the measurement of the outer trench can allow one to determine the location of the test plane relative to the plane of interest. In addition, the profile of this electroplated material can be seen and measured at this test plane. Then, by knowing the relationship between the test plane and the plane of interest, the actual critical dimension of the electroplated material at the plane of interest can be interpolated by the measurement of the outer trench width and the profile of the electroplated material at the test plane.

Figure 19:
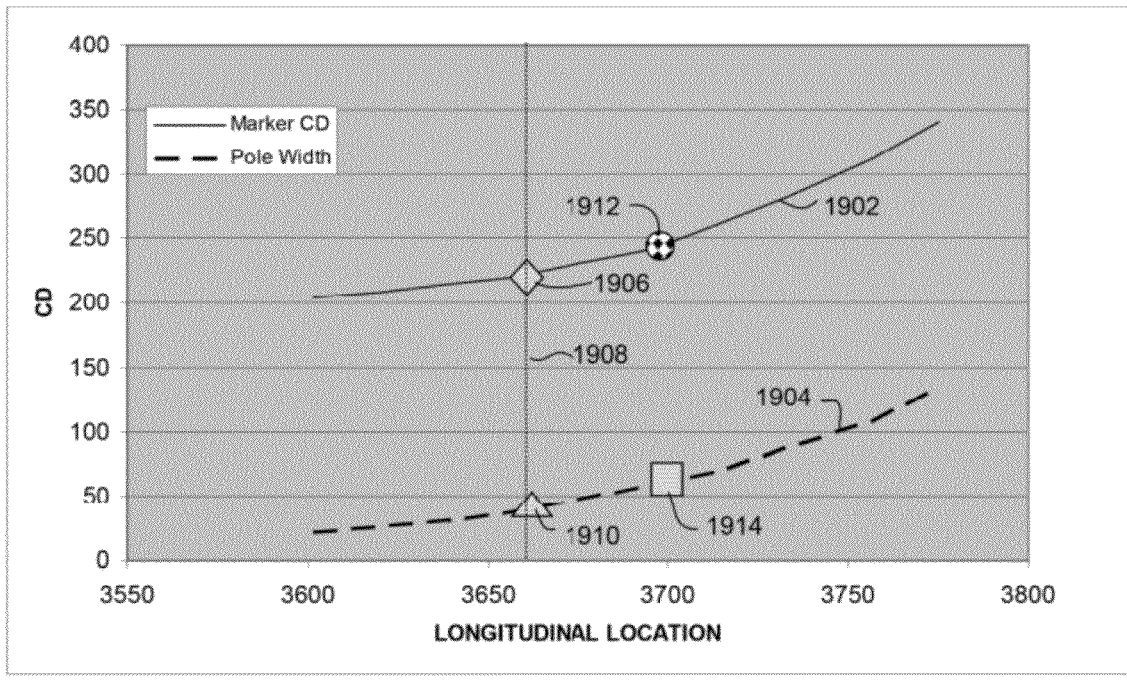
FIG. 19 is a graph showing curves for marker dimension vs longitudinal location and critical dimension of interest vs longitudinal location.
Figure 20:
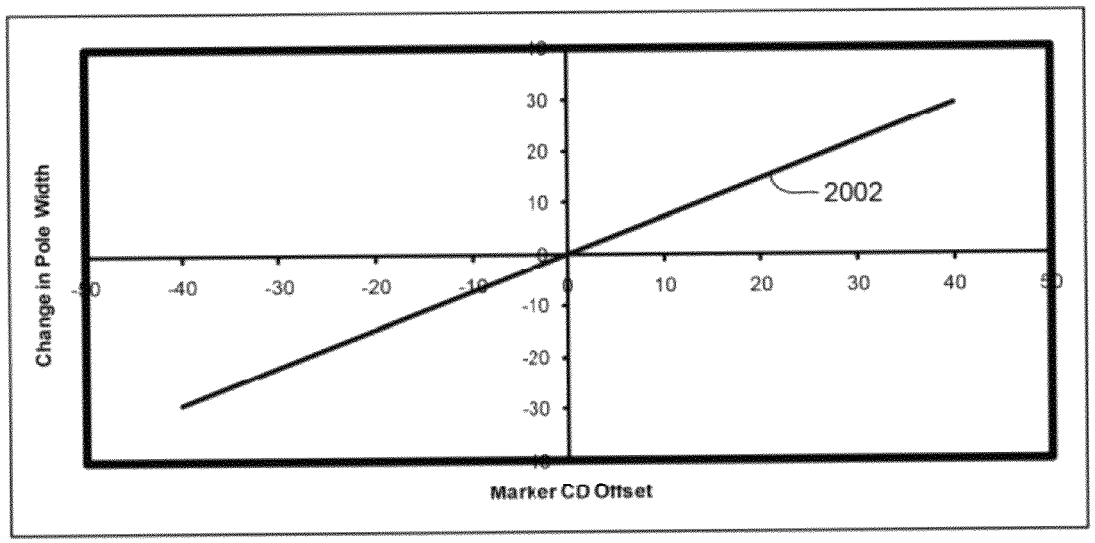
FIG. 20 is a graph showing critical dimension change vs longitudinal offset.

With reference to FIGS. 19 and 20, a method for extrapolating the critical dimension of interest is described in greater detail. As discussed above, the method of the present invention allows one to determine a critical dimension of a structure of interest at a plane of interest by measuring a related dimension of the structure and a marker dimension in a test plane. With reference now to FIG. 19, a curve 1902 shows how a marker dimension of a secondary feature changes with longitudinal location. Curve 1904 shows how a certain critical dimension of a structure of interest varies with longitudinal location. By way of example, location 1906 corresponds to a measurement of a marker dimension at a test plane located at longitudinal location 1908. This marker dimension is a feature of a structure created by a reliable process that produces a well known shape, such as the outer trench width 1404 of the outer trench in FIG. 14 which is constructed by a reliable photolithographic process. Location 1910 on the curve 1904 is a measurement of a critical dimension of a structure of interest measured at that same test plane longitudinal location 1908. This could be, for example, the measurement of the track width of a write head at the test plane.

Location 1912 on the curve represents the marker dimension at the longitudinal location of the plane of interest (e.g. the air bearing surface in the case of a write head). The marker dimension at this location is well known and fixed. By measuring the difference between the marker dimension at 1912 and the measured marker dimension 1906 we can find determine where the test plane actually is relative to the plane of interest.

Now, with regard to curve 1904, the location of this curve 1904 on the vertical axis is not initially known, although the shape (e.g. slope) of this curve is known (as will be discussed below). However, by measuring the critical dimension of the structure of interest at this test plane the location of point 1910 can be determined. In this way, the location of the curve on the x axis can be determined. Then, by following this curve 1904 to location 1914 the actual critical dimension of the structure of interest (e.g. the write pole track width) at the plane of interest can determined. The point 1914 represents a point on curve 1904 that is at the same longitudinal location as the point 1912.

FIG. 20 is a graph showing how a critical feature of a structure of interest (e.g. write pole width) varies with marker offset. The marker offset is the distance between the point 1912 and 1906 as measured along the horizontal axis in FIG. 19. While this relationship (represented in FIG. 20 by line 2002) may not be exactly a straight line, at very small offset dimensions it will approach a straight line. Therefore, it can effectively be assumed to be a straight line, the slope of which is determined either by experimentation or by modeling. Therefore, this line 2002 can be used to determine the slope of the line 1904 at any point along the horizontal axis (i.e. at any longitudinal location). While the vertical axis in FIG. 20 is labeled as "pole width" in FIG. 20, this is by way of example as this process could be used to determine the critical dimensions of other features and structures.

While various embodiments have been described, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a metallic structure, comprising:
   depositing a fill material over a substrate;
   forming a trench in the fill material, the trench having an outer trench width;
   depositing a trench width reducing material into the trench to form an inner trench;
   electroplating a metallic material into the inner trench;
   slicing the substrate, fill material, trench width reducing material and metallic material along a test plane;
   measuring the outer trench width at the test plane; and
   determining a critical dimension of the metallic material at a plane of interest based on the measurement of the outer trench width at the test plane.

2. The method as in claim 1 wherein the trench width reducing material is deposited by a conformal deposition method.

3. The method as in claim 1 wherein the trench width reducing material is deposited by atomic layer deposition.

4. The method as in claim 1 wherein the trench width reducing material is deposited by chemical vapor deposition.

5. The method as in claim 1 wherein the trench width reducing material is Ru.

6. The method as in claim 1 further comprising measuring a critical dimension of the metallic material at the test plane, and wherein the determination of the critical dimension of the metallic material at the plane of interest is based on the measurement of the outer trench width at the test plane and the measurement of the critical dimension of the metallic material at the test plane.

7. The method as in claim 6 wherein the determination of the critical dimension of the metallic material at the plane of interest is based on a known relationship between outer track width and plane location.

8. The method as in claim 6 further comprising determining a location of the test plane relative to the plane of interest based on the measurement of the outer trench width at the plane of interest and a known relationship between outer trench width and plane location.

9. The method as in claim 1 wherein the trench width reducing material comprises a non-magnetic metal deposited by a conformal deposition process and the metallic material deposited into the inner trench comprise a magnetic metal.

10. The method as in claim 1 further comprising, after determining the critical dimension of the metallic material at the plane of interest based on the measurement of the outer trench width at the test plane, performing a planarizing process to remove metallic material extending outside of the inner trench.

11. The method as in claim 10 wherein the planarizing process comprises chemical mechanical polishing.

12. The method as in claim 10 wherein the planarizing process comprises ion milling.

13. The method as in claim 10 wherein the planarizing process comprises a combination of chemical mechanical polishing and ion milling.

14. A method for manufacturing a magnetic write head, comprising:
    providing a substrate;
    depositing a fill material over the substrate;
    forming a trench in the fill material the trench defining an outer trench width;
    depositing a non-magnetic track-width reducing material into the trench to define an inner trench having a narrower width than the outer trench width;
    electroplating a magnetic metal into the inner trench;
    slicing the substrate; fill material, non-magnetic track-width reducing material and electroplated magnetic metal along a test plane;
    measuring the outer trench width at the test plane; and
    determining a critical dimension of the electroplated magnetic metal at a plane of interest based on the measurement of the outer trench width at the test plane.

15. The method as in claim 14 further comprising, measuring a critical dimension of the electroplated magnetic metal at the test plane, and wherein the determination of the critical dimension of the magnetic metal at the plane of interest is determined by the measured outer trench width at the test plane and the measured critical dimension of the electroplated magnetic metal at the test plane.

16. The method as in claim 14 wherein a location of the test plane relative to the plane of interest is determined by the measurement of the outer trench width at the test plane.

17. The method as in claim 16 wherein the location of the test plane relative to the plane of interest is additionally determined by a known relationship between outer trench width and plane location.

18. The method as in claim 14 further comprising, after determining the critical dimension of the metallic material at a plane of interest based on the measurement of the outer trench width at the test plane, performing a planarizing process to remove portions of the magnetic metal that extend outside of the inner trench.

19. The method as in claim 18 wherein the planarizing process comprises chemical mechanical polishing.

20. The method as in claim 18 wherein the planarizing process comprises ion milling.

21. The method as in claim 18 wherein the planarizing process comprises a combination of chemical mechanical polishing and ion milling.

* * * * *